United States Patent
Lee et al.

(10) Patent No.: US 10,447,376 B2
(45) Date of Patent: Oct. 15, 2019

(54) WIRELESS COMMUNICATION APPARATUS AND METHOD USING TRANSMISSION LINE FOR TRANSFERRING SIGNAL

(71) Applicant: ELECTRONICS AND TELECOMMUNICATIONS RESEARCH INSTITUTE, Daejeon (KR)

(72) Inventors: Hak June Lee, Daejeon (KR); Seung Il Myong, Daejeon (KR); Hoe Sung Yang, Daejeon (KR); Kang Bok Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/265,049

(22) Filed: Feb. 1, 2019

(65) Prior Publication Data
US 2019/0288769 A1 Sep. 19, 2019

(30) Foreign Application Priority Data
Mar. 15, 2018 (KR) ........................ 10-2018-0030496

(51) Int. Cl.
| H04B 7/145 | (2006.01) |
| H01P 1/30 | (2006.01) |
| H03H 7/42 | (2006.01) |
| H03H 7/38 | (2006.01) |

(52) U.S. Cl.
CPC ............... *H04B 7/145* (2013.01); *H01P 1/30* (2013.01); *H03H 7/38* (2013.01); *H03H 7/42* (2013.01)

(58) Field of Classification Search
CPC ......... H04B 10/2575; H04B 3/00; H04B 7/26
See application file for complete search history.

(56) References Cited

U.S. PATENT DOCUMENTS

| 5,600,097 A | 2/1997 | Bleich et al. |
| 7,397,321 B2 | 7/2008 | Hyun et al. |
| 8,344,999 B2 | 1/2013 | Choi et al. |

(Continued)

FOREIGN PATENT DOCUMENTS

| KR | 10-1999-0033004 A | 5/1999 |
| KR | 10-0879451 B1 | 2/2009 |

(Continued)

*Primary Examiner* — Keith Ferguson
(74) *Attorney, Agent, or Firm* — LRK Patent Law Firm (57) ABSTRACT

A communication method in a wireless communication system includes receiving, by a resonator unit of a first signal transfer apparatus, a wireless signal transmitted from a transmission apparatus, acquiring resonance energy from the wireless signal using at least one of a matcher unit and the resonator unit of the first signal transfer apparatus, transferring the wireless signal to one end of a transmission line via the matcher unit of the first signal transfer apparatus using the acquired resonance energy, transferring the wireless signal to a second signal transfer apparatus connected to an opposite end of the transmission line, and transmitting the wireless signal to a reception apparatus having a wireless link established with the second signal transfer apparatus using a matcher unit and a resonator unit of the second signal transfer apparatus.

19 Claims, 6 Drawing Sheets

(56) References Cited

U.S. PATENT DOCUMENTS

| | | |
|---|---|---|
| 9,699,732 B2 | 7/2017 | Kim et al. |
| 9,768,836 B2 | 9/2017 | Scholz |
| 9,773,585 B1 | 9/2017 | Rogers |
| 10,382,976 B2 * | 8/2019 | Bennett ................ H04W 16/26 |
| 2006/0148939 A1 | 7/2006 | Pinto |
| 2016/0261151 A1 | 9/2016 | Kim et al. |

FOREIGN PATENT DOCUMENTS

| | | |
|---|---|---|
| KR | 10-2014-0026061 A | 3/2014 |
| KR | 10-1711001 B1 | 3/2017 |
| KR | 10-1751433 B1 | 6/2017 |

* cited by examiner

WIRELESS COMMUNICATION APPARATUS AND METHOD USING TRANSMISSION LINE FOR TRANSFERRING SIGNAL

CROSS-REFERENCE TO RELATED APPLICATION

This application claims priority to and the benefit of Korean Patent Application No. 10-2018-0030496, filed Mar. 15, 2018, the disclosure of which is incorporated herein by reference in its entirety.

BACKGROUND

1. Field of the Invention

The present invention relates to a communication method and apparatus, and more specifically, to a communication method and apparatus that ensure efficient and prompt communication in a disaster situation.

2. Description of Related Art

Rescue workers deployed at a disaster site or natural disaster site, such as a building collapse site or a fire, use a lifeline for rapid and safe return from the disaster or natural disaster site. The lifeline is connected or attached to the body of the rescue worker. Using the lifeline enables the rescue worker to rapidly return to an entrance that is passed by the rescue worker in the complex and chaotic disaster site. In addition, the lifeline may serve as an evacuation guide line or a rappel rope for aiding other rescue workers or disaster victims in the disaster sites in rapidly escaping or evacuating the disaster sites.

In addition, the rescue worker deployed at a disaster site, such as a fire site or underground rescue site, requires wireless communication using communication facilities to perform a rapid status report to a command and control center and reception of a command from the command and control center or to perform communication between the rescue workers. However, communication facilities installed in buildings are composed of active circuits that require power, and such communication facilities composed of active circuits may not operate normally due to breakage and the like in the disaster and natural disaster sites, such as fire and building collapse, and there is a case in which communication facilities have not been originally installed. In addition, the rescue workers may be deployed at a place where wireless signal transmission/reception between communication apparatuses is not smooth, for example, an underground space, and conduct rescue activities.

SUMMARY OF THE INVENTION

The present invention is directed to providing a communication method using a flame-retardant coated transmission line for functioning as a lifeline and a communication available for use at a disaster site.

The present invention is directed to providing a communication apparatus using a flame-retardant coated transmission line for functioning as a lifeline and a communication available for use at a disaster site.

The technical objectives of the present invention are not limited to the above, and other objectives may become apparent to those of ordinary skill in the art based on the following descriptions.

According to an aspect of the present invention, there is provided a communication method of a wireless communication system, the communication method including: receiving, by a resonator unit of a first signal transfer apparatus, a wireless signal transmitted from a transmission apparatus; acquiring resonance energy from the wireless signal using at least one of a matcher unit and the resonator unit of the first signal transfer apparatus; transferring the wireless signal to one end of the transmission line via the matcher unit of the first signal transfer apparatus using the acquired resonance energy; transferring the wireless signal to a second signal transfer apparatus connected to an opposite end of the transmission line; and transmitting the wireless signal to a reception apparatus having a wireless link established with the second signal transfer apparatus using a matcher unit and a resonator unit of the second signal transfer apparatus.

The first signal transfer apparatus may be connected to the one end of the transmission line using a first connector, and the second signal transfer apparatus may be connected to the opposite end of the transmission line using a second connector.

The communication method may further include: transferring the wireless signal to the one end of a transmission line that is connected to the second connector through an expansion connector connected to the second connector; transferring the wireless signal to the opposite end of the transmission line that is connected through the expansion connector; transferring the wireless signal to a third signal transfer apparatus that is connected to the opposite end of the transmission line that is connected through the expansion connector; and transmitting the wireless signal to the reception apparatus having a link established with the third signal transfer apparatus using at least one of a matcher unit and a resonator unit of the third signal transfer apparatus.

The opposite end of the transmission line connected through the expansion connector may be connected to the third signal transfer apparatus through a third connector.

The transmission apparatus having a wireless link established with the first signal transfer apparatus and the reception apparatus having the wireless link established with the second signal transfer apparatus and the third signal transfer apparatus may be provided as a communication terminal or a desk type communication apparatus.

The first signal transfer apparatus, the second signal transfer apparatus, and the third signal transfer apparatus may be replaceable according to a communication scheme with the transmission apparatus and/or the reception apparatus having the wireless link established with the first signal transfer apparatus, the second signal transfer apparatus, and the third signal transfer apparatus.

The resonator unit of each of the first signal transfer apparatus, the second signal transfer apparatus, and the third signal transfer apparatus may include an antenna.

The matcher unit of each of the first signal transfer apparatus, the second signal transfer apparatus, and the third signal transfer apparatus may perform impedance matching, and may include at least one of a balun and a transformer.

According to another aspect of the present invention, there is provided a communication apparatus of a wireless communication system, the communication apparatus including: a first signal transfer apparatus configured to receive a wireless signal from a transmission apparatus having a wireless link established with the first signal transfer apparatus and acquire resonance energy; a second signal transfer apparatus configured to transmit the wireless signal to a reception apparatus having a wireless link established with the second signal transfer apparatus using the acquired resonance energy; and a transmission line coated with a flame-retardant material and configured to transfer the wireless signal from the first signal transfer apparatus to the second signal transfer apparatus using the acquired resonance energy, wherein the first signal transfer apparatus is connected to one end of the transmission line, and the second signal transfer apparatus is connected to an opposite end of the transmission line.

The first signal transfer apparatus may be connected to the one end of the transmission line using a first connector, and the second signal transfer apparatus may be connected to the opposite end of the transmission line using a second connector.

The second connector may be connected to and separated from an expansion connector.

The wireless communication apparatus may further include a third signal transfer apparatus connected to the opposite end of a transmission line that is connected to the expansion connector, wherein the third signal transfer apparatus may have a wireless link established with a reception apparatus that is the same as or different from the reception apparatus.

The opposite end of the transmission line connected to the third signal transfer apparatus through the expansion connector may be connected to the third signal transfer apparatus through a third connector.

The transmission apparatus having the wireless link established with the first signal transfer apparatus and the reception apparatus having the wireless link established with the second signal transfer apparatus and the third signal transfer apparatus may be provided as a communication terminal or a desk type communication apparatus.

The first signal transfer apparatus, the second signal transfer apparatus, and the third signal transfer apparatus may be replaceable according to a communication scheme with the transmission apparatus and/or the reception apparatus having the wireless link established with the first signal transfer apparatus, the second signal transfer apparatus, and the third signal transfer apparatus.

Each of the first signal transfer apparatus, the second signal transfer apparatus, and the third signal transfer apparatus may include at least one of a resonator unit and a matcher unit that performs impedance matching.

The first signal transfer apparatus may acquire the resonance energy using the at least one of the resonator unit and the matcher unit.

The resonator unit may include an antenna.

The matcher unit may include at least one of a balun and a transformer.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

While the present invention is susceptible to various modifications and alternative forms, specific embodiments are shown by way of example in the drawings and described in detail. It should be understood, however, that the description is not intended to limit the present invention to the specific embodiments, but, on the contrary, the present invention is to cover all modifications, equivalents, and alternatives that fall within the spirit and scope of the present invention.

Although the terms "first," "second," etc. may be used herein in reference to various elements, such elements should not be construed as limited by these terms. These terms are only used to distinguish one element from another. For example, a first element could be termed a second element, and a second element could be termed a first element, without departing from the scope of the present invention. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directed coupled" to another element, there are no intervening elements.

The terminology used herein is for the purpose of describing particular embodiments only and is not intended to be limiting of embodiments of the present invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms (including technical and scientific terms) used herein have the same meaning as commonly understood by those of ordinary skill in the art to which the present invention pertains. It will be further understood that terms defined in commonly used dictionaries should be interpreted as having a meaning that is consistent with their meaning in the context of the related art and will not be interpreted in an idealized or overly formal sense unless expressly so defined herein.

Hereinafter, exemplary embodiments of the present invention will be described in greater detail with reference to the accompanying drawings. To facilitate overall understanding of the present invention, like numbers refer to like elements throughout the description of the drawings, and description of the same component will not be reiterated.

Figure 1:
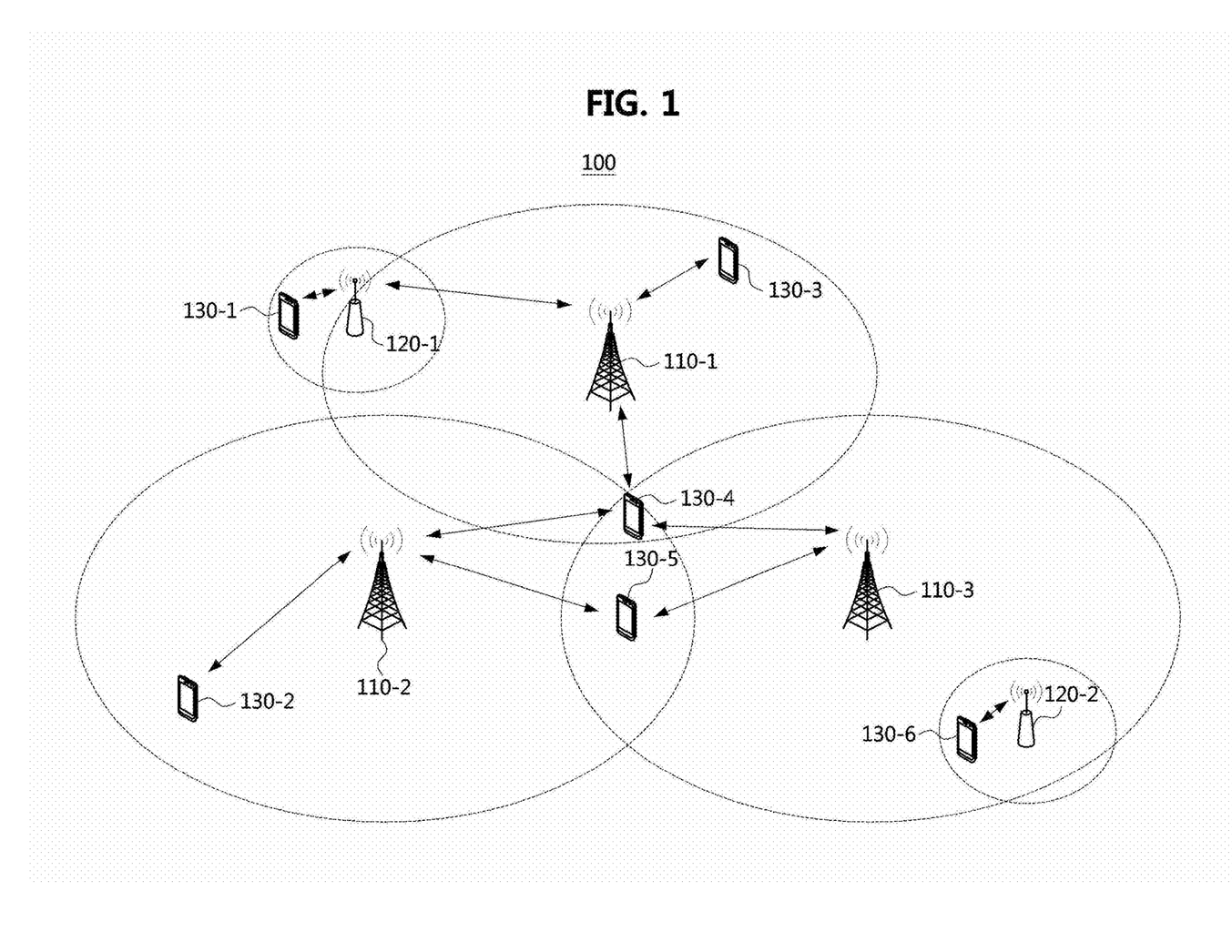
FIG. 1 is a conceptual diagram illustrating a first embodiment of a communication system.

FIG. 1 is a conceptual diagram illustrating a first embodiment of a communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. Here, the communication system may also be referred to as a 'communication network'. Each of the plurality of communication nodes may support at least one communication protocol. For example, each of the plurality of communication nodes may support at least one communication protocol among a code division multiple access (CDMA) based communication protocol, a wideband CDMA (WCDMA) based communication protocol, a time division multiple access (TDMA) based communication protocol, a frequency division multiple access (FDMA) based communication protocol, an orthogonal frequency division multiplexing (OFDM) based communication protocol, an orthogonal frequency division multiple access (OFDMA) based communication protocol, a single carrier FDMA (SC-FDMA) based communication protocol, a non-orthogonal multiple access (NOMA) based communication protocol, and a space division multiple access (SDMA) based communication protocol. Also, each of the plurality of communication nodes may have the following structure.

Figure 2:
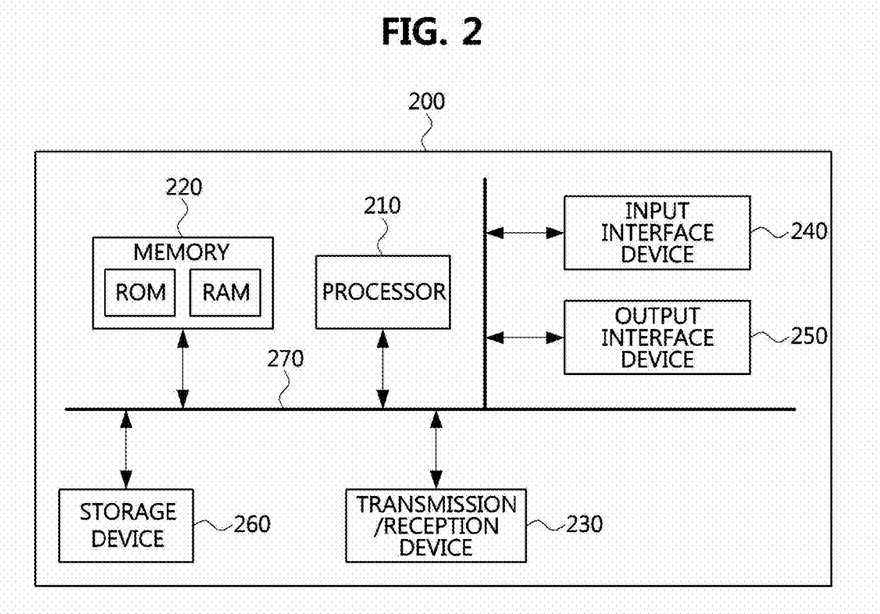
FIG. 2 is a block diagram illustrating an embodiment of a communication node constituting a communication system.

FIG. 2 is a block diagram illustrating a first embodiment of a communication node constituting a cellular communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270. However, each component included in the communication node 200 may be connected to the processor 210 via an individual interface or a separate bus, rather than the common bus 270. For example, the processor 210 may be connected to at least one of the memory 220, the transceiver 230, the input interface device 240, the output interface device 250, and the storage device 260 via a dedicated interface.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring again to FIG. 1, the communication system 100 may comprise a plurality of base stations 110-1, 110-2, 110-3, 120-1, and 120-2, and a plurality of terminals 130-1, 130-2, 130-3, 130-4, 130-5, and 130-6. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to cell coverage of the first base station 110-1. Also, the second terminal 130-2, the fourth terminal 130-4, and the fifth terminal 130-5 may belong to cell coverage of the second base station 110-2. Also, the fifth base station 120-2, the fourth terminal 130-4, the fifth terminal 130-5, and the sixth terminal 130-6 may belong to cell coverage of the third base station 110-3. Also, the first terminal 130-1 may belong to cell coverage of the fourth base station 120-1, and the sixth terminal 130-6 may belong to cell coverage of the fifth base station 120-2.

Here, each of the plurality of base stations 110-1, 110-2, 110-3, 120-1, and 120-2 may refer to a Node-B, a evolved Node-B (eNB), a gNB, an ng-eNB, a base transceiver station (BTS), a radio base station, a radio transceiver, an access point, an access node, a road side unit (RSU), a radio remote head (RRH), a transmission point (TP), a transmission and reception point (TRP), a flexible TRP (f-TRP), gNB, or the like. Also, each of the plurality of terminals 130-1, 130-2, 130-3, 130-4, 130-5, and 130-6 may refer to a user equipment (UE), a terminal, an access terminal, a mobile terminal, a station, a subscriber station, a mobile station, a portable subscriber station, a node, a device, a device supporting internet of things (IoT) functions, a mounted module/device/ terminal, an on-board unit (OBU), or the like.

Meanwhile, each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul or a non-ideal backhaul, and exchange information with each other via the ideal or non-ideal backhaul. Also, each of the plurality of base stations 110-1, 110-2, 110-3, 120-1, and 120-2 may be connected to the core network through the ideal or non-ideal backhaul. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

Also, each of the plurality of base stations 110-1, 110-2, 110-3, 120-1, and 120-2 may support a multi-input multi-output (MIMO) transmission (e.g., a single-user MIMO (SU-MIMO), a multi-user MIMO (MU-MIMO), a massive MIMO, or the like), a coordinated multipoint (CoMP) transmission, a carrier aggregation (CA) transmission, a transmission in unlicensed band, a device-to-device (D2D) communications (or, proximity services (ProSe)), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2 (i.e., the operations supported by the plurality of base stations 110-1, 110-2, 110-3, 120-1, and 120-2). For example, the second base station 110-2 may transmit a signal to the fourth terminal 130-4 in the SU-MIMO manner, and the fourth terminal 130-4 may receive the signal from the second base station 110-2 in the SU-MIMO manner. Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner.

The first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

Hereinafter, wireless communication technologies using a broadband signal transmission line will be described. Here, even when a method (e.g., transmission or reception of a signal) to be performed in a first communication node among communication nodes is described, a corresponding second communication node may perform a method (e.g., reception or transmission of the signal) corresponding to the method performed in the first communication node. That is, when an operation of a terminal is described, a corresponding base station may perform an operation corresponding to the operation of the terminal. Conversely, when an operation of the base station is described, the corresponding terminal may perform an operation corresponding to the operation of the base station.

Also, data may also refer to a packet, a data packet, or a protocol data unit (PDU). The packet may mean the data itself or a portion corresponding to a payload that is distinguished from a header in the data.

Figure 3:
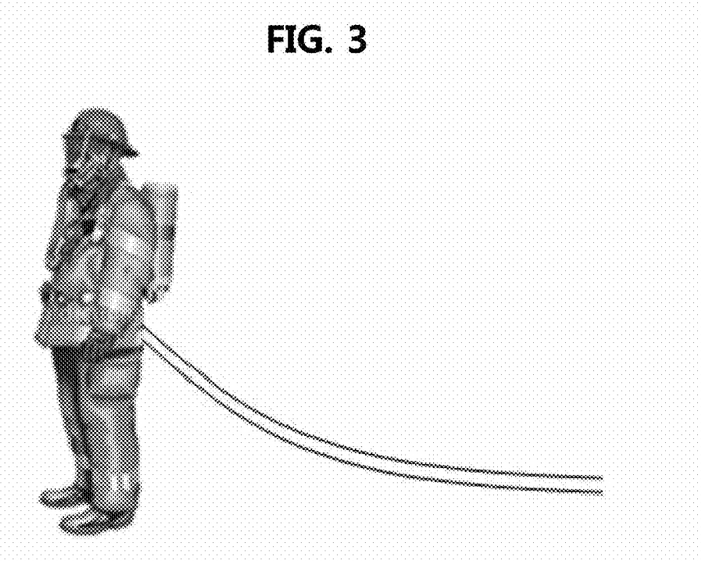
FIG. 3 is a conceptual diagram illustrating a use of a lifeline according to the related art.

FIG. 3 is a conceptual diagram illustrating a use of a lifeline according to the related art.

Referring to FIG. 3, the lifeline according to the related art is used by being connected to a back of a rescue suit of a rescue worker. As described above, the lifeline according to the related art does not serve to transfer a communication signal and only serves as an evacuation guide line and a rappel rope. Meanwhile, there is a need for rapid communication between rescue workers or between a rescue worker and a command and control center such that the rescue worker deployed at a disaster site performs a smooth rescue operation. Accordingly, the lifeline needs to be used not only for the original purpose as an evacuation guide line or a rappel rope but also as a communication apparatus considering a disaster rescue site where wireless communication is not smooth.

In particular, when communication facilities (for example, a wireless repeater, a signal amplifier, and the like) installed at the disaster site are broken due to fire or the like, and thus a wireless communication apparatus used by the rescue worker does not operate normally, or when rescue operations are conducted in a place where transfer of wireless signals is not smooth, such as an underground space, tall buildings, and the like, the lifeline also needs to be used as a transmission line for communication signals. Hereinafter, a communication apparatus using a flame-retardant coated transmission line according to an embodiment of the present invention that does not only serve as an evacuation guide line and a rappel rope as in the related art but also serves as a transmission line for broadband signal transfer will be described.

Figure 4:
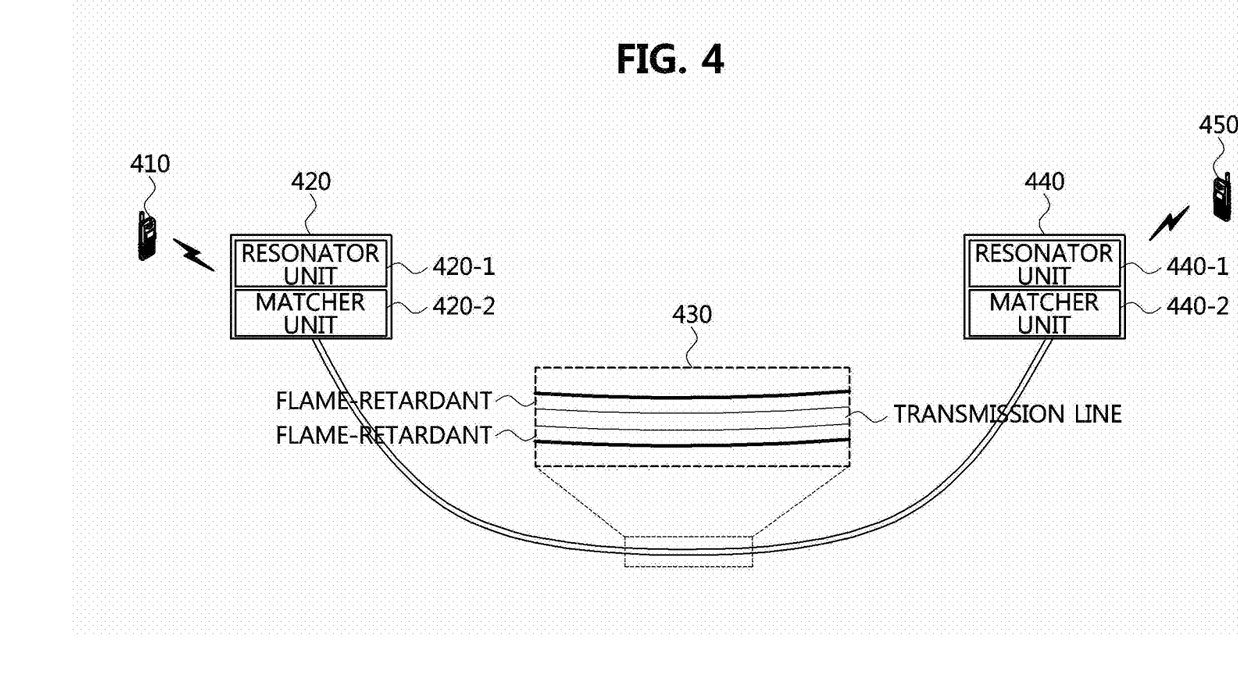
FIG. 4 is a conceptual diagram illustrating a communication apparatus including a flame-retardant coated transmission line according to an embodiment of the present invention.

FIG. 4 is a conceptual diagram illustrating a communication apparatus including a flame-retardant coated transmission line according to an embodiment of the present invention.

Referring to FIG. 4, signal transfer apparatuses 420 and 440 having received wireless signals from external communication devices 410 and 450 acquire a driving power from the received wireless signals and perform wireless communication through a flame-retardant coated transmission line 430.

The external communication devices 410 and 450 represent a communication terminal that is carried by a rescue worker for each use and includes a device using a common frequency, such as a radio transceiver, a trunked radio system (TRF) device, and the like, or a general mobile communication terminal device. In addition, the external communication devices 410 and 450 may include a fixed or desk-type communication device installed in a command and control center. The signal transfer apparatuses 420 and 440 that transmit and receive wireless signals to and from the external communication devices 410 and 450 do not receive power in a wired manner from the outside or through a replaceable general battery embedded therein. The signal transfer apparatuses 420 and 440 according to the embodiment of the present invention may receive wireless signals from the external communication devices 410 and 450 through resonator units 420-1 and 440-1 included in the signal transfer apparatuses 420 and 440. The resonator units 420-1 and 440-1 of the signal transfer apparatuses 420 and 440 may be implemented to receive a broadband wireless signal.

The resonator units 420-1 and 440-1 may include resonance antennas (not shown). In general, a resonance antenna is provided such that a reactance component of antenna impedance is set to zero and only a resistive component remains, to thereby minimize impedance components, allowing a received wireless signal to have a maximum power when transferred to another circuit part connected to the resonance antenna. The resonator units 420-1 and 440-1 of the signal transfer apparatuses 420 and 440 having received wireless signals from the external communication devices 410 and 450 according to the embodiment of the present invention shown in FIG. 4 may transfer the wireless signals, which have maximum power, to matcher units 420-2 and 440-2 of the signal transfer apparatuses 420 and 440. The wireless signal output from the matcher unit 420-2 or 440-2 of the signal transfer apparatus 420 or 440 is transferred to one end of the transmission line 430 connected to the signal transfer apparatus 420 or 440, and then may be transferred to the signal transfer apparatus 440 or 420 connected to the opposite end of the transmission line 430. In this case, in order to transmit the wireless signal from one of the signal transfer apparatuses to the other thereof via the transmission line, minimum power (electricity) for driving is required. Such a driving power may be obtained by acquiring (or generating) resonance energy through resonance of the wireless signal received by the resonator units 420-1 and 440-1.

Meanwhile, when the wireless signals of the external communication devices 410 and 450, which are received by the signal transfer apparatuses 420 and 440, are transmitted to the transmission line 430, the matcher units 420-2 and 440-2 of the signal transfer apparatuses 420 and 440 may allow impedance components of the signal transfer apparatuses 420 and 440 to maximally match impedance components of the transmission line 430. Accordingly, wireless signal components received by the signal transfer apparatuses 420 and 440 are maximally inputted to the transmission line 430 without being reflected from a contact portion of the transmission line 430.

The matcher units 420-2 and 440-2 of the signal transfer apparatuses 420 and 440 may be implemented as a balun (balanced to unbalanced) and/or a transformer. In general, a balanced wireless signal received by an antenna is transferred to an unbalanced internal transmission cable. The balun serves to convert the balanced antenna reception signal into an unbalanced coaxial cable input signal. According to the embodiment of the present invention, a wireless signal of a reverse phase form (a balanced form) transferred from the resonator unit 420-1 or 440-1 including an antenna is converted into a ground and a signal component of an unbalanced form, so that as much of the wireless signal is transferred to the transmission line 430, such as a coaxial cable, as possible, without experiencing missing signals.

The transmission line 430 may be coated with a flame retardant or flame resistant to maximally maintain the function thereof even in a disaster situation, such as a fire. The transmission line 430 may be implemented using any cable as long as a broadband electrical signal (including high frequency signals) can be transferred through the cable, for example, a coaxial cable, a stranded cable, a single line, and the like. Flame retardant refers a substance that is not easily burned in the event of a fire or the like. The transmission line 430 may be coated with materials and substances used as the flame retardant. In addition, the transmission line 430 may be manufactured by adding a material having sufficient rigidity and/or ductility to an outer surface or inner surface of the coating to function as a lifeline, such as an evacuation guide line and/or a rappel rope. Further, in order to serve as a lifeline in a dark space, the outside of the transmission line 430 may be coated with a fluorescent material or may be provided with an element that emits light with a low current.

An expansion connector (not shown) may be attached to one end or both ends of the transmission line 430, to which a signal transfer apparatus is not attached, to further connect another transmission line. FIG. 4 illustrates an example in which the two signal transfer apparatuses 420 and 440 are connected to each other through one transmission line 430, but the present invention is not limited thereto, and three or more signal transfer apparatuses may be connected to each other by connecting a plurality of transmission lines. To this end, an expansion connector for connecting two or more transmission lines may be attached to one end of a transmission line. The expansion connector may be implemented using an active circuit that may amplify a signal to be transferred, or may be configured to simply transfer a signal without amplification. Hereinafter, a signal transfer apparatus according to an embodiment of the present invention will be described in detail.

Figure 5:
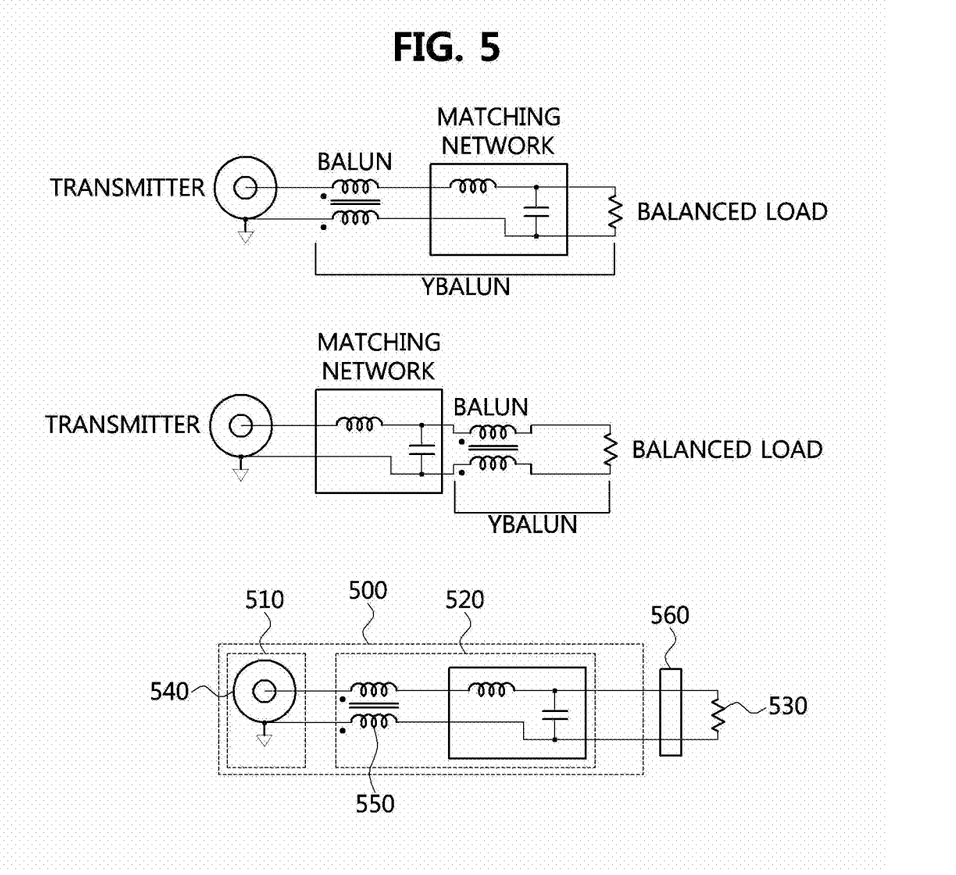
FIG. 5 is a block diagram illustrating a signal transfer apparatus according to an embodiment of the present invention.

FIG. 5 is a block diagram illustrating a signal transfer apparatus according to an embodiment of the present invention.

Referring to FIG. 5, a wireless signal received by a resonator unit 510 of a signal transfer apparatus 500 is transferred to a transmission line 530 through a matcher unit 520. The resonator unit 510 may include an antenna unit 540. Since a wireless signal transmitted from an external communication device (not shown) having a wireless link established with the signal transfer apparatus 500 is a balanced signal when received by the antenna unit 540 of the resonator unit 510 of the signal transfer apparatus 500, the wireless signal is converted into an unbalanced signal by a balun 550 of the matcher unit 520. As described above, since the transmission line 530 has an unbalanced form, the balun 550 is required. In addition, the matcher unit 520 may perform an impedance matching such that the input wireless signal is maximally transferred to the transmission line 530.

As described above, the signal transfer apparatus 500 may perform wireless communication with various types of external communication devices (not shown). Accordingly, a signal transfer apparatus 500 capable of using a wireless communication scheme of the external communication device may be detachably coupled to the transmission line 530 using a connector 560. The connector 560 may be positioned between the signal transfer apparatus 500 and the transmission line 530 to perform connection or separation between the signal transfer apparatus 500 and the transmission line 530. The connector 560 may be provided at the transmission line 530, provided at the signal transfer apparatus 500, or provided at each of the transmission line 530 and the signal transfer apparatus 500.

As described above, the transmission line 530 according to the embodiment of the present invention may be manufactured by adding a material having sufficient stiffness and/or ductility to an outer surface or inner surface of the coating to function as a lifeline, such as an evacuation guide line and/or a rappel rope. Further, in order to serve as a lifeline in a dark space, the outside of the transmission line 530 may be coated with a fluorescent material or provided with an element that emits light with a low current. Hereinafter, a method of signal transmission/reception of a communication apparatus including a flame-retardant coated transmission line according to an embodiment of the present invention will be described.

Figure 6:
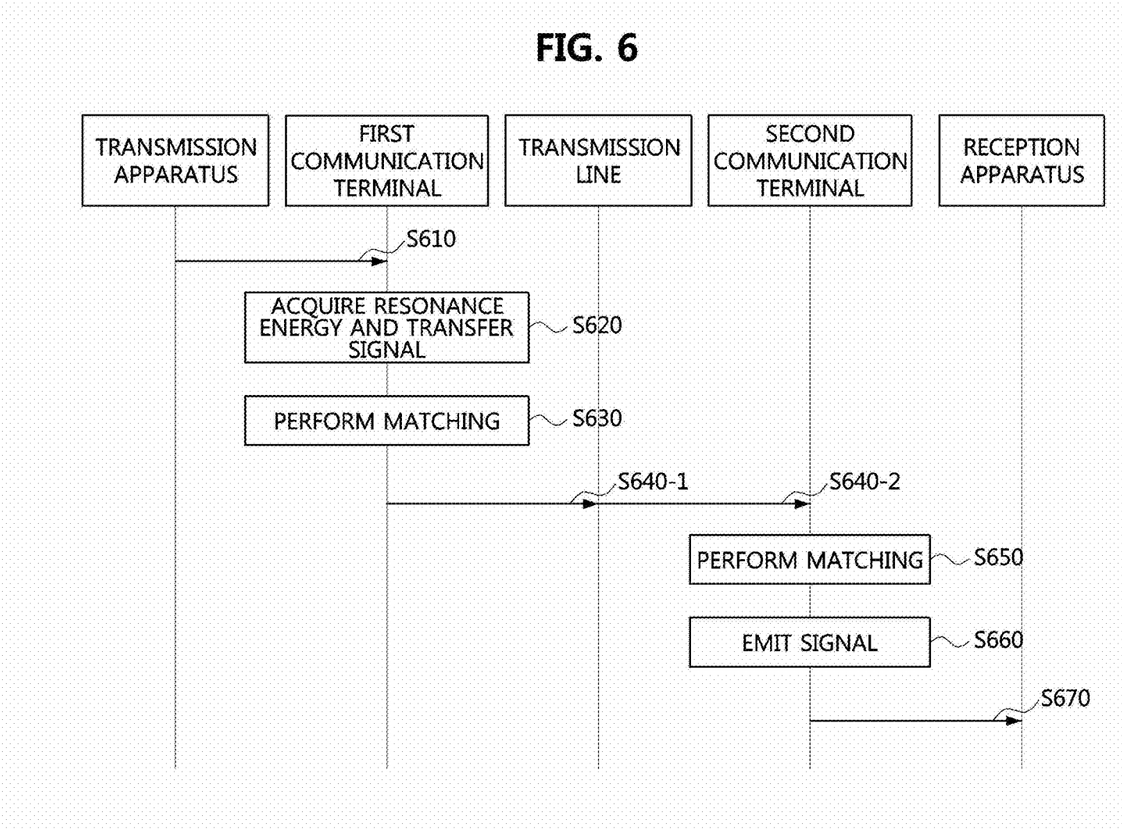
FIG. 6 is a flowchart showing a method of data transmission/reception of the communication apparatus including a flame-retardant coated transmission line according to the embodiment of the present invention.

FIG. 6 is a flowchart showing a method of data transmission/reception of the communication apparatus including a flame-retardant coated transmission line according to the embodiment of the present invention.

Referring to FIG. 6, a wireless signal transmitted from a transmission apparatus is transmitted to a reception apparatus through the communication apparatus according to the embodiment of the present invention. As described above, the transmission apparatus may be a radio transceiver carried by a rescue worker, a TRF, a general mobile communication device, a desk-type communication device, or the like. A wireless signal transmitted from the transmission apparatus may be received by a first signal transfer apparatus that is a component of the communication apparatus including the flame-retardant coated transmission line according to the embodiment of present invention (hereinafter, referred to as a 'communication apparatus') (S610). The first signal transfer may include a resonator unit and a matcher unit as described above. The first signal transfer apparatus may be replaced to support a wireless communication scheme of the transmission apparatus and attached to the transmission line. The first signal transfer apparatus acquires resonance energy from the received wireless signal, and transfers the wireless signal to the matcher unit and the transmission line using the resonance energy as a driving power (620). The matcher unit of the first signal transfer apparatus may perform a balun function and matching function (impedance matching) with (or without) a balun (S630), and then transmit the wireless signal to the transmission line (S640-1). The wireless signal may be transferred from one end of the transmission line to a second signal transfer apparatus connected to the other end of the transmission line (S640-2). A matcher unit of the second signal transfer apparatus having received the wireless signal (with or without a balun) may perform matching (impedance matching) for transmitting the wireless signal to a wireless channel area (S650), and transmit the wireless signal to a reception apparatus through a resonator unit of the second signal transfer apparatus (S660). The transmitted wireless signal may be transmitted to the reception apparatus (S670).

Although not shown in FIG. 6, the above-described detachable expansion connector may be connected to a connector provided at the other end of the transmission line to which the second signal transfer apparatus is connected such that two or more transmission lines may be connected (the expansion connector may be integrally formed with the connector provided at the other end of the transmission line to which the second signal transfer apparatus is connected, so that one of the expansion connector and the connector may perform the function of the other one as well as its own function). The wireless signal of the transmission apparatus may be transmitted to signal transfer apparatuses connected to opposite ends of the two or more transmission lines connected through the expansion connector. The two or more signal transfer apparatuses having received the wireless signal through the expansion connector may transmit the wireless signal to reception apparatuses having communication links established with the two or more signal transfer apparatuses.

In this case, one reception apparatus may have a communication link established with the two or more signal transfer apparatuses including the second signal transfer apparatus, or two or more reception apparatuses may have communication links established with the second signal transfer apparatus. Similarly, the transmission apparatus having a communication link established with the first signal transfer apparatus may have the communication link established with two or more signal transfer apparatuses, and the first signal transfer apparatus may also have a communication link established with two or more transmission apparatuses. Hereinafter, an example of communication between a plurality of users using the communication apparatus including the flame-retardant coated transmission line according to an embodiment of the present invention will be described.

Figure 7:
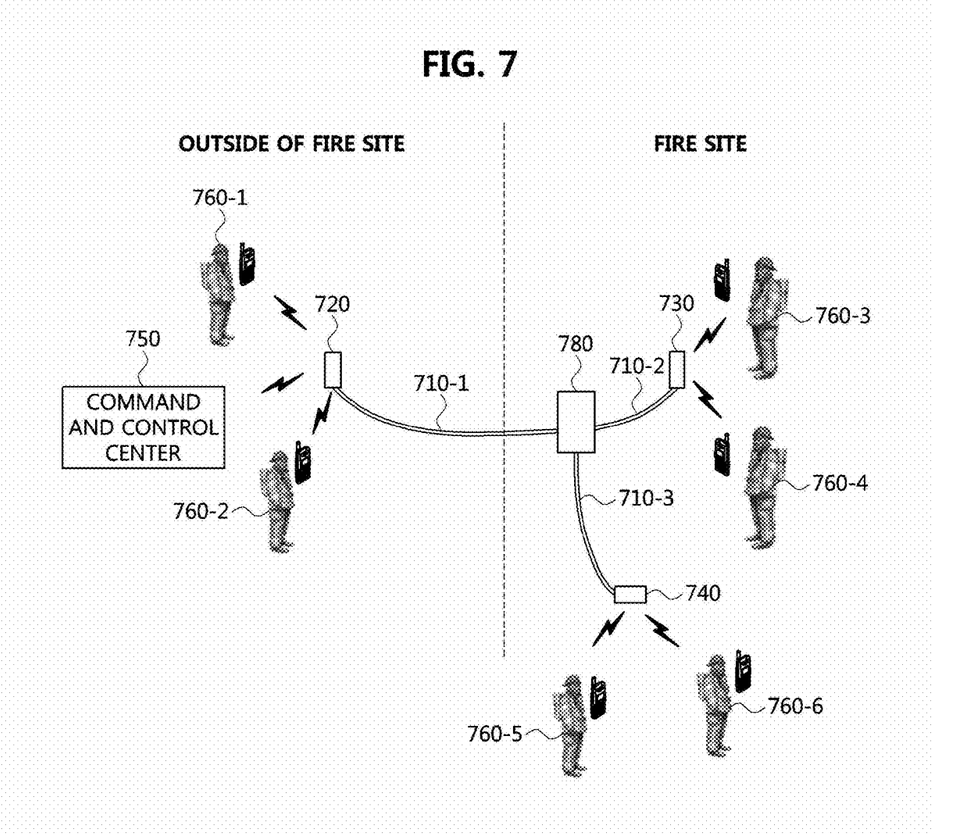
FIG. 7 is a conceptual diagram for describing a method of communication between users using the communication apparatus including a flame-retardant coated transmission line according to the embodiment of the present invention.

FIG. 7 is a conceptual diagram for describing a method of communication between users using the communication apparatus including a flame-retardant coated transmission line according to the embodiment of the present invention.

Referring to FIG. 7, a wireless communication is performed between communication apparatuses 760-1, 760-2, 760-3, 760-4, 760-5, and 760-6, which are held by rescue workers, and a command and control center 750 through signal transfer apparatuses 720, 730, and 740 connected to flame-retardant coated transmission lines 710-1, 710-2, and 710-3 according to the embodiment of the present invention, in which particularly, the plurality of transmission lines 710-1, 710-2, and 710-3 are connected using an expansion connector 780. As described above, the expansion connector 780 may be connected to a connector provided at one end of a transmission line and include an active circuit for signal amplification.

The first signal transfer apparatus 720 may receive a wireless signal from the communication apparatuses 760-1 and 760-2 and the command and control center 750 that have a wireless link established with the first signal transfer apparatus 720, and may transfer the wireless signal to the transmission line 710-1 and to the second signal transfer apparatus 730 and the third signal transfer apparatus 740 attached to ends of other transmission lines 710-2 and 710-3 connected to the expansion connector 780. The communication apparatuses 750, 760-1, and 760-2 having a wireless link established with the first signal transfer apparatus 720 may perform wireless communication with the communication apparatuses 760-3 and 760-4 having a wireless link established with the second signal transfer apparatus 730, also with the communication apparatuses 760-5 and 760-6 having a wireless link established with the third signal transfer apparatus 740. As opposed to the embodiment described with reference to FIG. 7, a larger number of communication apparatuses may be connected by additionally connecting a plurality of expansion connectors.

As is apparent from the above, the communication method and apparatus can rapidly and efficiently conduct a rescue activity by transporting wireless broadband signals as well as serving as an evacuation guide line and a rappel rope at disaster sites where wireless communication is limited.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:
1. A wireless communication method using a transmission line, the wireless communication method comprising:
receiving, by a resonator unit of a first signal transfer apparatus, a wireless signal transmitted from a transmission apparatus;
acquiring resonance energy from the wireless signal using at least one of a matcher unit and the resonator unit of the first signal transfer apparatus;
transferring the wireless signal to one end of the transmission line via the matcher unit of the first signal transfer apparatus using the acquired resonance energy;
transferring the wireless signal to a second signal transfer apparatus connected to an opposite end of the transmission line; and
transmitting the wireless signal to a reception apparatus having a wireless link established with the second signal transfer apparatus using a matcher unit and a resonator unit of the second signal transfer apparatus.

2. The wireless communication method of claim 1, wherein the first signal transfer apparatus is connected to the one end of the transmission line using a first connector, and the second signal transfer apparatus is connected to the opposite end of the transmission line using a second connector.

3. The wireless communication method of claim 2, further comprising:
transferring the wireless signal to the one end of a transmission line that is connected to the second connector through an expansion connector connected to the second connector;

transferring the wireless signal to the opposite end of the transmission line that is connected through the expansion connector;

transferring the wireless signal to a third signal transfer apparatus that is connected to the opposite end of the transmission line that is connected through the expansion connector; and transmitting the wireless signal to the reception apparatus having a link established with the third signal transfer apparatus using at least one of a matcher unit and a resonator unit of the third signal transfer apparatus.

4. The wireless communication method of claim 3, wherein the opposite end of the transmission line connected through the expansion connector is connected to the third signal transfer apparatus through a third connector.

5. The wireless communication method of claim 3, wherein the transmission apparatus having a wireless link established with the first signal transfer apparatus and the reception apparatus having the wireless link established with the second signal transfer apparatus and the third signal transfer apparatus are provided as a communication terminal or a desk type communication apparatus.

6. The wireless communication method of claim 3, wherein the first signal transfer apparatus, the second signal transfer apparatus, and the third signal transfer apparatus are replaceable according to a communication scheme with the transmission apparatus and/or the reception apparatus having the wireless link established with the first signal transfer apparatus, the second signal transfer apparatus, and the third signal transfer apparatus.

7. The wireless communication method of claim 3, wherein the resonator unit of each of the first signal transfer apparatus, the second signal transfer apparatus, and the third signal transfer apparatus includes an antenna.

8. The wireless communication method of claim 3, wherein the matcher unit of each of the first signal transfer apparatus, the second signal transfer apparatus, and the third signal transfer apparatus performs impedance matching, and includes at least one of a balun and a transformer.

9. A wireless communication apparatus using a transmission line, the wireless communication apparatus comprising:
a first signal transfer apparatus configured to receive a wireless signal from a transmission apparatus having a wireless link established with the first signal transfer apparatus and acquire resonance energy;
a second signal transfer apparatus configured to transmit the wireless signal to a reception apparatus having a wireless link established with the second signal transfer apparatus using the acquired resonance energy; and
a transmission line coated with a flame-retardant material and configured to transfer the wireless signal from the first signal transfer apparatus to the second signal transfer apparatus using the acquired resonance energy,
wherein the first signal transfer apparatus is connected to one end of the transmission line, and the second signal transfer apparatus is connected to an opposite end of the transmission line.

10. The wireless communication apparatus of claim 9, wherein the first signal transfer apparatus is connected to the one end of the transmission line using a first connector, and the second signal transfer apparatus is connected to the opposite end of the transmission line using a second connector.

11. The wireless communication apparatus of claim 10, wherein the second connector is connected to and separated from an expansion connector.

12. The wireless communication apparatus of claim 11, further comprising a third signal transfer apparatus connected to the opposite end of a transmission line that is connected to the expansion connector, wherein the third signal transfer apparatus has a wireless link established with a reception apparatus that is the same as or different from the reception apparatus.

13. The wireless communication apparatus of claim 12, wherein the opposite end of the transmission line connected to the third signal transfer apparatus through the expansion connector is connected to the third signal transfer apparatus through a third connector.

14. The wireless communication apparatus of claim 12, wherein the transmission apparatus having the wireless link established with the first signal transfer apparatus and the reception apparatus having the wireless link established with the second signal transfer apparatus and the third signal transfer apparatus are provided as a communication terminal or a desk type communication apparatus.

15. The wireless communication apparatus of claim 12, wherein the first signal transfer apparatus, the second signal transfer apparatus, and the third signal transfer apparatus are replaceable according to a communication scheme with the transmission apparatus and/or the reception apparatus having the wireless link established with the first signal transfer apparatus, the second signal transfer apparatus, and the third signal transfer apparatus.

16. The wireless communication apparatus of claim 12, wherein each of the first signal transfer apparatus, the second signal transfer apparatus, and the third signal transfer apparatus includes at least one of a resonator unit and a matcher unit that performs impedance matching.

17. The wireless communication apparatus of claim 16, wherein the first signal transfer apparatus acquires the resonance energy using the at least one of the resonator unit and the matcher unit.

18. The wireless communication apparatus of claim 16, wherein the resonator unit includes an antenna.

19. The wireless communication apparatus of claim 16, wherein the matcher unit includes at least one of a balun and a transformer.

* * * * *